(12) United States Patent
Harper, Jr. et al.

(10) Patent No.: US 6,303,991 B1
(45) Date of Patent: Oct. 16, 2001

(54) ELECTRONIC PACKAGE AND CONTACT THEREFOR

(75) Inventors: Donald K. Harper, Jr., Harrisburg; Timothy A. Lemke, Dillsburg, both of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/321,320

(22) Filed: May 27, 1999

(51) Int. Cl.[7] ................................................... H01L 23/48
(52) U.S. Cl. ........................ 257/734; 257/693; 257/737; 257/738; 257/778
(58) Field of Search ................................. 257/734, 693, 257/737, 738, 778, 780, 784; 438/411, 461, 611, 613, 108

(56) References Cited

U.S. PATENT DOCUMENTS

| | | | |
|---|---|---|---|
| 3,924,918 | 12/1975 | Friend | 339/17 M |
| 5,288,944 | 2/1994 | Bronson et al. | 174/52.4 |
| 5,420,461 | * 5/1995 | Mallik et al. | 257/734 |
| 5,457,879 | * 10/1995 | Gurtler et al. | 29/895 |
| 5,484,964 | * 1/1996 | Dawson et al. | 174/261 |
| 5,490,040 | 2/1996 | Gaudenzi et al. | 361/773 |
| 5,641,945 | 6/1997 | Abe et al. | 174/261 |
| 5,646,442 | 7/1997 | Abe et al. | 257/697 |
| 5,768,770 | * 7/1998 | Horton et al. | 29/827 |

* cited by examiner

Primary Examiner—Jhihan B Clark
(74) Attorney, Agent, or Firm—Woodcock Washburn Kurtz Mackiewicz & Norris LLP

(57) ABSTRACT

An electronic package and contacts therefor are disclosed. The package includes a planar base and a plurality of conductive pads positioned on one planar side of the base. Each contact is formed as a generally unitary body from a conductive material, and is conductively coupled to a respective one of the pads. Each contact has a coupling tab and a longitudinally extending blade coupled to the tab. The tab extends along the respective pad and is coupled thereto. The blade extends perpendicularly with respect to the one planar side of the base.

19 Claims, 2 Drawing Sheets

ELECTRONIC PACKAGE AND CONTACT THEREFOR

FIELD OF THE INVENTION

The present invention relates to an electronic package and a contact for use in connection with such electronic package. More particularly, the present invention relates to such a contact wherein contact density on the electronic package may be increased and profile height may be decreased, thereby improving electrical performance by decreasing inductance and allowing higher speed operation.

BACKGROUND OF THE INVENTION

Typically, a microprocessor, controller, or other micro-electronic device is mounted or housed within an electronic package. Typically, such electronic package also includes contacts for coupling such package to a corresponding connector or connection area on a substrate, as well as leads coupling the contacts to the electronic device mounted or housed within such package. As may often be the case, the micro-electronic device within the package requires a relatively high number of connections to the outside world, and therefore a relatively high number of contacts on the package.

In one type of prior art electronic package, a plurality of pads are arranged on one planar side of the package into an array, and a pin contact is solder- or braze-coupled to each pad. Accordingly, the package with the pin contacts is appropriately mated to a corresponding connector or connection area on a substrate, where such connector or connection area has pin-receiving contacts arranged into a corresponding array. As should be understood, each pin may be removably inserted into a corresponding pin-receiving contact, or may be secured to such corresponding pin-receiving contact by way of a solder or the like.

Typically, each pin extends a certain length and has a relatively smaller pin-size cross-section. Also typically, each pin has a connecting base for being coupled to a pad on the package, where the connecting base has a relatively larger cross-section. Importantly, the relatively smaller pin-size cross-section of each pin must be large enough to provide structural integrity and resist crumpling when all of such pins are inserted into such corresponding pin-receiving contacts. Also importantly, the relatively larger cross-section of each contact base must be large enough, especially at the longitudinal end thereof, to provide a sufficient coupling area and a minimum surface area contact between such contact base and its corresponding pad on the package. For these and other known reasons, contact pins arranged into an array on one planar side of the base of an electronic package must be spaced with a minimum distance of about 0.1 inches.

As should be understood, though, such minimum spacing requirement results in a rather substantial use of real estate by the electronic package on the substrate. Accordingly, a need exists for an electronic package and a contact therefor, wherein the minimum spacing requirement for each contact is smaller than that for the aforementioned contact pins. Accordingly, the density of contacts on such electronic package may be increased, and real estate usage on the substrate may be reduced.

SUMMARY OF THE INVENTION

The present invention satisfies the aforementioned need by providing an electronic package comprising a generally planar base and a plurality of conductive pads positioned on one planar side of the base. The electronic package also has a plurality of contacts, where each contact is formed as a generally unitary body from a conductive material, and is conductively coupled to a respective one of the pads. Each contact has a coupling tab extending generally along the respective pad, where the tab is coupled to the respective pad, and a generally longitudinally extending blade coupled to the tab and extending generally perpendicularly with respect to the one planar side of the base.

BRIEF DESCRIPTION OF THE DRAWINGS

The foregoing summary as well as the following detailed description of the present invention will be better understood when read in conjunction with the appended drawings. For the purpose of the illustrating the invention, there are shown in the drawings embodiments which are presently preferred. As should be understood, however, the invention is not limited to the precise arrangements and instrumentalities shown. In the drawings.

DETAILED DESCRIPTION OF PREFERRED EMBODIMENTS

Figure 1:
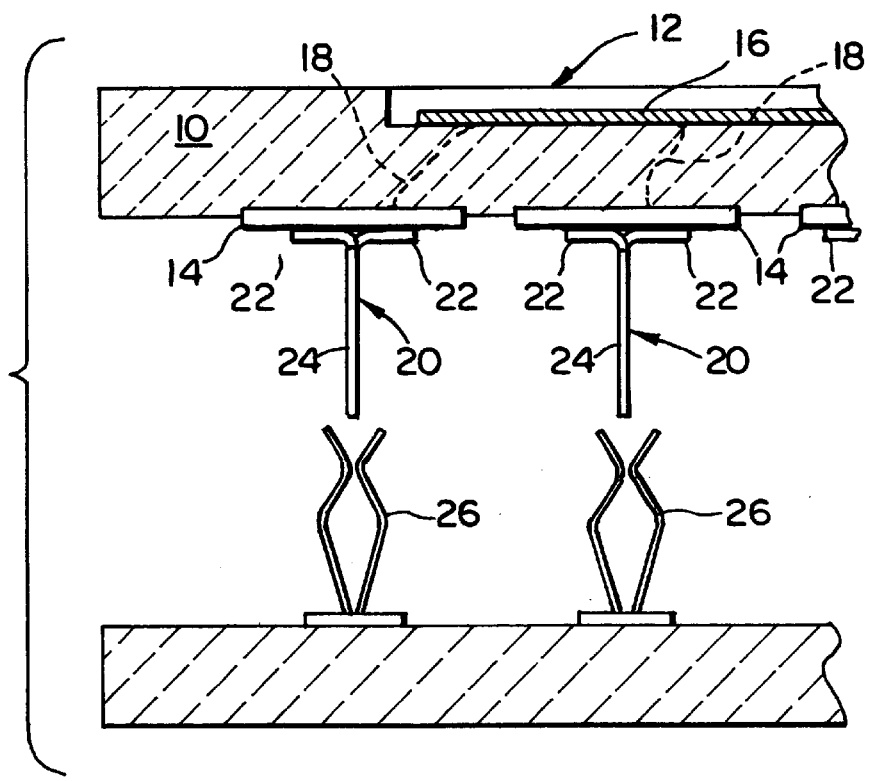
FIG. 1 is an elevational view of an electronic package including a plurality of contacts therefor in accordance with one embodiment of the present invention, where such package is to be mated to a substrate by way of such contacts.

Certain terminology may be used in the following description for convenience only and is not considered to be limiting. For example, the words "left", "right", "upper", and "lower" designate directions in the drawings to which reference is made. Likewise, the words "inwardly" and "outwardly" are directions toward and away from, respectively, the geometric center of the referenced object. The terminology includes the words above specifically mentioned, derivatives thereof, and words of similar import.

Figure 2:
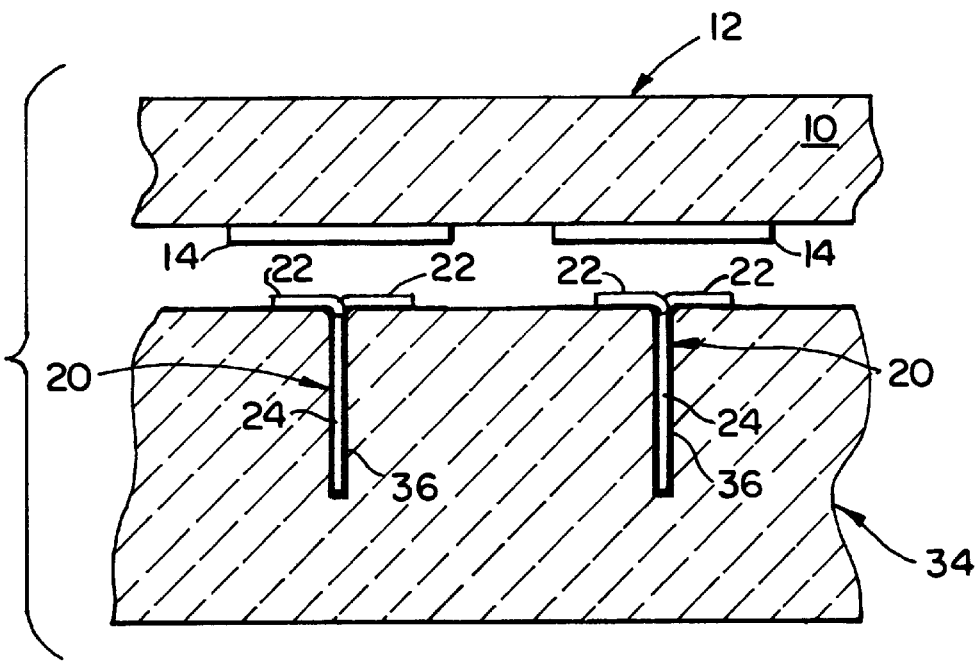
FIG. 2 is an elevational view similar to that of FIG. 1, and shows the contacts of FIG. 1 held in a jig in preparation for being coupled to pads on one planar side of the base of the electronic package to form such electronic package.
Figure 3:
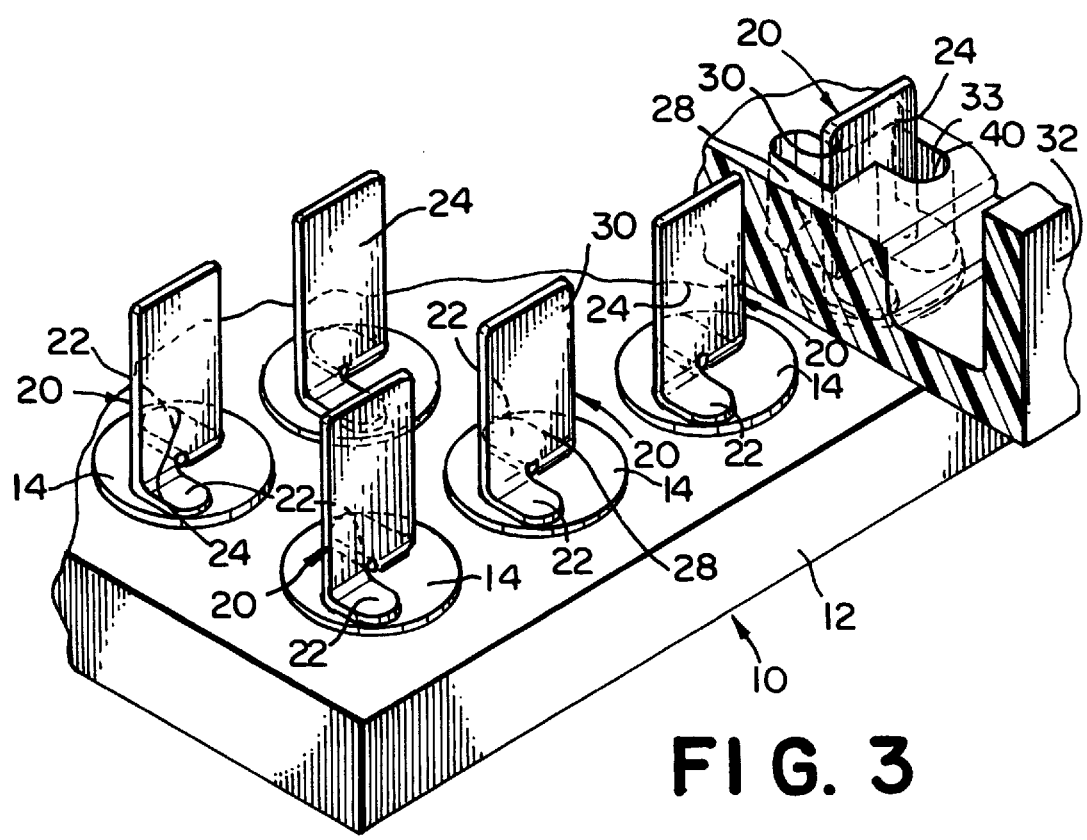
FIG. 3 is a perspective view of a plurality of the contacts mounted to the pads on the base of the electronic package of FIG. 1, and shows a housing mounted to the electronic package at the one planar side of the base.

Referring to the drawings in detail, wherein like numerals are used to indicate like elements throughout, there is shown in FIGS. 1–3 an electronic package 10 constructed in accordance with the present invention. As seen, the package 10 can have conventional components which include a generally planar base 12, and a plurality of conductive pads 14 positioned on one planar side of the base 12. As should be understood and as is shown, the base 12 of the package 10 can include an electrical device 16 as well as electrical paths 18 that electrically couple the electrical device 16 to the pads 14. The electrical device 16 may be any electrical device without departing from the spirit and scope of the present invention, and also may comprise sub-components, each mounted to the base 12 of the package 10. For example, the electrical device 16 may be one or more chips or other micro-circuits, such as a processor, a controller, a memory, a gate array, a logic device, a signal generator, or the like.

Preferably, each pad is formed from a conductive material such as a copper material, a brass material, a stainless steel material, a gold material, a metal alloy material, or the like. However, each pad 14 may be formed from any other conductive material without departing from the spirit and scope of the present invention. In addition, each pad may be mounted to the base 12 by any appropriate method without departing from the spirit and scope of the present invention.

Preferably, the base is formed from a non-conductive material such as a ceramic material, a polymeric material, a thermosetting resin (e.g., FR4) or an elastomeric material. As will be discussed below, in the event the base 12 is to be exposed to relatively high temperatures, it is preferable that such base is formed from a ceramic material.

As seen in FIGS. 1 through 3, the electronic package 10 also comprises a plurality of contacts 20, where each contact 20 is conductively coupled to a respective one of the pads 14. Preferably, each contact 20 is formed as a generally unitary body from a conductive material such as KOVAR (a low coefficient of thermal expansion (CTE) material). However, each contact 20 could be formed from any suitable conductive material including a copper material, a brass material, a stainless steel material, a gold material, a metal alloy material, or the like. Preferably, and as seen, each contact 20 has at least one coupling tab 22 that extends generally along the respective pad 14, where the tab 22 is coupled to the respective pad 14. Also preferably, each contact 20 has a generally longitudinally extending blade 24 that is coupled to the tab 22 and that extends generally perpendicularly with respect to the one planar side of the base 12.

In one embodiment in the present invention, and as seen in FIGS. 1 through 3, each contact 20 has a pair of generally opposingly extending coupling tabs 22 that extend generally along the respective pad 14, where each tab is coupled to the respective pad 14. As should be appreciated, such a contact 20 is generally T-shaped. Such contact 20 may be constructed with such tabs 22 accorded to any method and with any constructing equipment without departing from the spirit and scope of the present invention. As should be understood, the pair of generally opposingly extending coupling tabs 22 is preferable since such arrangement provides a secure mounting of the contact 20 to the respective pad 14, especially in the presence of a transversely exerted force on such contact 20.

In one construction method, each contact 20 is stamped from a planar sheet of material, and a longitudinal slit is introduced into one end of such contact either during or after the stamping operation, thus resulting in a pair of laterally arranged tabs 22 at the one end and the blade 24 as the main body of the contact 20. As should be understood, each lateral tab 22 is then bent off from the contact 20 in an opposing direction to result in a final form. Preferably, each tab 22 is bent about 90 degrees with respect to the planar surface of the blade 24 of the contact 20, and the bend line is at about 90 degrees with respect to the longitudinal extent of the blade 24 and contact 20. Such bending operation may be performed with an appropriate die and/or a contact-holding jig (not shown).

As should be understood, the blade 24 has a longitudinal and lateral extent, but very little thickness. In fact, in one embodiment of the present invention, such blade has a longitudinal extent of about 1.5 mm, a lateral extent of about 0.8 mm, and a thickness of about 0.1 mm, while each tab 22 extends about 0.3 mm from the blade 24. A contact 20 with such blade 24 and tabs 22 is preferable in higher densities and lower profile heights of contacts 20 on a package 10, because each blade 24 and therefore each contact 20 can be made smaller, especially as compared with the prior art contact pin. In turn, the smaller blade contacts 20 can be mounted on smaller pads 14 as compared with such prior art contact pin by way of the tabs 22, and therefore may be more densely arranged on a package 10 and have a smaller profile height.

In particular, by using a blade contact 20 as shown in FIGS. 1–3 and not a conventional contact pin, contact spacing may be reduced in half from about 0.1 inches to about 0.05 inches, with a resulting four-fold increase in contact density on a package 10. Accordingly, an electronic package 10 having the blade contacts 20 arranged in a higher contact density can be mated to a substrate in a smaller amount of real estate. Of course, the corresponding structure 26 (as seen in FIG. 1) for accepting each blade contact 20 must also be capable of achieving the same relatively high density, as will be described below.

With particular reference to FIG. 3, now, it is seen that each blade 24 has a proximal portion 28 relatively close to the base 12 and a distal portion 30 that is farther away from the base 12 than the proximal portion 28. In at least one embodiment of the present invention, at least the proximal portion 28 has, for example, a notch (not shown) which provides a mechanically compliant section that allows for thermal expansion in the blade 24 and blade contact 20 during operation of the electronic device 16 in the package 10.

In particular, and as should be understood, during operation, such device 16 will produce heat, and such blade 24 and blade contact 20 will absorb some of that heat. Such absorbed heat will result in thermal expansion in such blade 24 and blade contact 20, and the mechanical compliancy in at least the proximal portion 28 of the blade 24 ensures that repeated cycles of such thermal expansion and thermal contraction do not weaken the joint, nor in effect push the package 10 out of the corresponding structures 26 on the mated-to substrate. As should be understood, the mechanical compliancy is preferably in directions generally parallel to the one planar side of the base 12.

As should also be understood, such mechanical compliancy in at least the proximal portion 28 of each blade 24, as well as the overall relatively small size of the blade 24, may reduce the strength of the blade 24 and blade contact 20. In particular, a relatively small force toward either planar side of the blade 24 may adversely affect such blade 24.

Accordingly, it is preferable that each blade 24 be supported by a housing 32. As seen in FIG. 3, the housing 32 may comprise one or more housing parts (one housing part is removed in FIG. 3), where each housing part surrounds a plurality of the blades 24. The housing 32 includes corresponding apertures 33 therethrough for accepting the blades 24. In particular, it is preferable that the housing 32 surround at least the proximal portion 28 of each blade 24. Such housing 32 may expose the distal portion 30 of each blade 24, as shown, or may also surround substantially all of the distal portion 30 of each blade 24. As should be understood, then, the housing 32 adds structural stability to each blade 24 and shields each blade from damage from errant forces.

Such housing 32 is preferably constructed with a good degree of precision with regard to placement of the apertures 33, wherein the apertures 33 are closely matched to the arrangement of the corresponding structures 26 on the mated-to substrate (FIG. 1). Accordingly, such housing 32 with such matched apertures 33 provides the added benefit of holding each blade 24 in alignment when the package 10 is mated with such corresponding structures 26 on such substrate.

Preferably, the housing 32 is constructed from a suitable dielectric material such as a polymeric material, an elastomeric material, or the like, although other materials may be employed without departing from the spirit and scope of the present invention. Also preferably, each blade 24 of each blade contact 20 maintains an interference fit within corresponding aperture 33 of the housing 32 to secure the housing 32 to the package 10.

Preferably, each contact 20 is braze coupled to a respective pad 14, where the brazing is performed at a relatively high temperature. In particular, in certain applications, such as for example high frequency applications, brazing is preferred over soldering because brazing provides a better connection. As should be understood, brazing minimizes resistive, inductive, capacitive, and other unwanted electrical features incumbent in electrical connections, especially as compared with soldering.

Accordingly, in one embodiment of the present invention, each contact 20 is braze-coupled at a relatively high temperature to its respective pad 14. Importantly, though, the brazing cannot be performed in the vicinity of the housing 32 inasmuch as the relatively high temperature of such brazing will tend to damage the housing 32, especially if such housing 32 is formed from a polymeric or elastomeric material. Accordingly, such braze-coupling should take place outside of the presence of the housing 32 unless such housing 32 can withstand the heat of the brazing process.

To accomplish such brazing outside the presence of the housing 32, then, and referring now to FIG. 2, it is preferable that a jig 34 be employed to hold each contact 20 as such contact 20 is being braze-coupled to its respective pad 14. In particular, and as seen, the jig 34 has a plurality of receiving apertures 36, where each receiving aperture 36 corresponds to and is aligned with a respective pad 14 on the one planar side of the base 12. Each contact 20 is thus placed in a receiving aperture 36 of the jig 34, and the jig 34 is moved into engagement with the one planar side of the base 12 such that each contact 20 placed in a receiving aperture 36 is aligned with and contacting its corresponding pad 14. As positioned, each contact may then be braze-coupled to the corresponding pad 14.

Preferably, and as shown, each contact 20 is placed in a receiving aperture 36 of the jig 34 such that the blade 24 of the contact 20 extends into the receiving aperture 36, and such that the coupling tab or tabs 22 remain exposed. Preferably, each receiving aperture 36 of the jig 34 securely and snugly holds the received contact 20. At the same time, the jig 34 should hold the received contacts 20 such that the jig 34 can without undue effort be withdrawn from the package 10 after the soldering operation has been completed. Preferably, the jig 34 is constructed from a material that can withstand the relatively higher braze-coupling temperature, such as a graphite material, a ceramic material, or the like. Any other appropriate high temperature material having a CTE similar to that of the base 12 may be employed without departing from the spirit and scope of the present invention.

As should be recognized, it may be the case that each contact 20 is to be coupled to a respective pad 14 by a soldering operation at a relatively low temperature, or it may be the case that the aforementioned brazing process is to be employed and the housing 32 can withstand the heat of such brazing process. In either case, the jig 34 may be dispensed with, and each contact 20 may be mounted to the housing 32, and the housing 32 with the mounted contacts 20 may then be appropriately positioned over the pads 14 on the base 12 for such soldering or brazing operation. To retain the mounted contacts 20 therein, the housing 32 may include a projection or rib (not shown) extending along each aperture 33.

Although the use of the jig 34 is especially advantageous in a situation where each contact 20 is braze-coupled to its respective pad 14, in that the jig 34 is constructed from a material that can withstand the relatively higher braze-coupling temperature, it will be recognized that the jig 34 may also be used in connection with other coupling techniques without departing from the spirit and scope of the present invention. For example, it may be advantageous to use the jig 34 in connection with a solder-coupling technique, even though the solder-coupling technique occurs at a relatively lower temperature, and can perhaps be performed with each contact 20 already mounted within the housing 32.

Whether each contact 20 is coupled to its respective pad 14 while positioned in the jig 34 or the housing 32, it is preferable that such jig 34 or such housing include keying devices (not shown) corresponding to keying devices (also not shown) on the one planar side of the base 12. Accordingly, such keying devices ensure that the contacts 20 are properly aligned with their respective pads 14. Any keying devices may be employed, as appropriate, without departing from the spirit and scope of the present invention. For example, such keying devices may include appropriate combinations of slots, grooves, ridges, posts, apertures, or the like.

Once each contact 20 has been coupled to its corresponding pad 14, and the jig 34 has been withdrawn from engagement with the base 12, the housing 32 is then mated to the package 10 by inserting each blade 24 of each contact 20 through a respective aperture 33 in the housing 32. Of course, care must be taken during such mating of such housing 32 to ensure that the blades 24 are aligned with the apertures 33, and to ensure that the force of mating does not crumple the blades 24.

In one embodiment of the present invention, and as seen in FIG. 3, each housing aperture 33 includes a pair of wells 40, where each well 40 extends into the housing 32 from the side of the housing facing away from the base 12. As shown, each well 40 of the pair is laterally offset in generally opposing directions with respect to the inserted blade 24, with one well 40 on either side of such blade 24. Referring now to FIG. 1, it is seen that in one embodiment of the present invention, the corresponding structure 26 that receives each blade 24 includes a pair of cantilevered spring arms 26.

As should now be understood, one spring arm 26 is laterally offset from the other spring arm 26 with respect to a blade 24 to be received therebetween. Each well 40 in the housing 32 of FIG. 3 thus accommodates one of the spring arms 26 associated with the blade 24 when the package 10 is mated to the substrate. Each well 40 thus may extend entirely through the housing 32, or may instead have a depth sufficient to receive and allow deflection of a spring arm 26.

Accordingly, while the housing 32 provides structural integrity for each blade 24 of each contact 20, such housing 32 also provides space to accommodate each corresponding receiving structure (spring arm) 26 on the mated-to substrate as each blade 24 of each contact 22 securely contacts such corresponding receiving structure (spring arm) 26. Of course, the corresponding receiving structure 26 may include a structure other than a pair of spring arms 26 as disclosed herein without departing from the spirit and scope of the present invention. In such case, the apertures 33 in the housing 32 may be altered to accommodate such other structure without departing from the spirit and scope of the present invention. For example, such apertures 33 could be formed without the wells 40 if such wells 40 are not necessary for accommodating spring arms 26.

In the foregoing description, it can be seen that the present invention comprises a new and useful electronic package 10 for being mated to a substrate, and a blade contact 20 for use in connection with such electronic package 10. Importantly, the use of such a blade contact 20 in connection with the electronic package 10 allows the density of contacts 20 on the package 10 to be increased, thus reducing the amount of real estate the package 10 occupies on the underlying mated-to substrate. It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. A contact for use in connection with an electronic package comprising a generally planar base and a plurality of conductive pads positioned on one planar side of the base, the contact being formed as a generally unitary body from a conductive material, the contact for being conductively coupled to one of the pads and comprising:

a pair of generally opposingly extending coupling tabs for extending generally along the pad, each tab being coupled to the pad, each tab being bent off from the contact at one lateral side of a proximal end thereof; and a generally longitudinally extending blade coupled to the tabs for extending generally perpendicularly with respect to the one planar side of the base.

2. The contact of claim 1 wherein the blade has a proximal portion for being relatively close to the base and a distal portion for being farther away from the base than the proximal portion, the proximal portion being mechanically compliant to allow for thermal expansion.

3. The contact of claim 1 wherein the blade has a proximal portion for being relatively close to the base and a distal portion for being farther away from the base than the proximal portion, the package further comprising a housing surrounding the proximal portion of the blade and exposing the distal portion of the blade, the housing for adding structural stability to the blade and for aligning the blade with a corresponding structure on a substrate to which the package is to be coupled, the distal portion of the blade being sized to fit through the housing.

4. The contact of claim 1 wherein the tab is braze-coupled to the pad.

5. The contact of claim 3 wherein the distal portion of the blade is inserted through the housing after the contact has been coupled to the pad.

6. An electronic package comprising:
   a generally planar base;
   a plurality of conductive pads positioned on one planar side of the base; and
   a plurality of contacts, each contact being formed as a generally unitary body from a conductive material, each contact being conductively coupled to a respective one of the pads and having:
      a coupling tab extending generally along the respective pad, the tab being coupled to the respective pad; and
      a generally longitudinally extending blade coupled to the tab and extending generally perpendicularly with respect to the one planar side of the base;
   the base including an electrical device and electrical paths electrically coupling the electrical device to the pads.

7. The package of claim 6 wherein each contact has a pair of generally opposingly extending coupling tabs extending generally along the respective pad, each tab being coupled to the respective pad.

8. The package of claim 6 wherein each blade has a proximal portion relatively close to the base and a distal portion farther away from the base than the proximal portion, the proximal portion being mechanically compliant to allow for thermal expansion.

9. The package of claim 6 wherein each blade has a proximal portion relatively close to the base and a distal portion farther away from the base than the proximal portion, the package further comprising a housing surrounding the proximal portion of each blade and exposing the distal portion of each blade, the housing for adding structural stability to each blade and for aligning each blade with a corresponding structure on a substrate to which the package is to be coupled.

10. The package of claim 6 wherein the base is formed from a ceramic material.

11. The package of claim 6 wherein each tab is braze-coupled to the respective pad.

12. The package of claim 7 wherein each contact has a proximal end with lateral sides, and wherein each contact tab is bent off from the contact at one lateral side of the proximal end thereof.

13. The package of claim 9 wherein the distal portion of each blade is inserted through the housing after each contact has been coupled to a respective one of the pads.

14. A contact for use in connection with an electronic package comprising a generally planar base and a plurality of conductive pads positioned on one planar side of the base, the contact being formed as a generally unitary body from a conductive material, the contact for being conductively coupled to one of the pads and comprising:

a coupling tab for extending generally along the pad, the tab for being coupled to the pad; and a generally longitudinally extending blade coupled to the tab for extending generally perpendicularly with respect to the one planar side of the base, the blade having a proximal portion for being relatively close to the base and a distal portion for being farther away from the base than the proximal portion, the package further comprising a housing surrounding the proximal portion of the blade and exposing the distal portion of the blade, the housing for adding structural stability to the blade and for aligning the blade with a corresponding structure on a substrate to which the package is to be coupled, the distal portion of the blade being sized to fit through the housing.

15. The contact of claim 14 comprising a pair of generally opposingly extending coupling tabs for extending generally along the pad, each tab being coupled to the pad.

16. The contact of claim 14 wherein the blade has a proximal portion for being relatively close to the base and a distal portion for being farther away from the base than the proximal portion, the proximal portion being mechanically compliant to allow for thermal expansion.

17. The contact of claim 14 wherein the distal portion of the blade is inserted through the housing after the contact has been coupled to the pad.

18. The contact of claim 14 wherein the tab is braze-coupled to the pad.

19. The contact of claim 15 comprising a proximal end with lateral sides, each contact tab being bent off from the contact at one lateral side of the proximal end thereof.

* * * * *